United States Patent
Won et al.

(10) Patent No.: US 7,781,155 B2
(45) Date of Patent: Aug. 24, 2010

(54) FABRICATION METHOD OF MICRO-LENS AND FABRICATION METHOD OF MASTER FOR MICRO-LENS

(76) Inventors: Hyong Sik Won, 2-1301 Samsung Apt., Woncheon-dong, Yeongtong-gu, Suwon, Gyunggi-do (KR); Jong Myeon Lee, 805-1107 Joogong Apt., Burim-dong, Gwacheon, Gyunggi-do (KR); Myung Whun Chang, 101-2007 Jinro Apt., Dongcheon-dong, Suji-gu, Yongin, Gyunggi-do (KR)

( * ) Notice: Subject to any disclaimer, the term of this patent is extended or adjusted under 35 U.S.C. 154(b) by 116 days.

(21) Appl. No.: 12/005,668

(22) Filed: Dec. 28, 2007

(65) Prior Publication Data
US 2008/0206682 A1    Aug. 28, 2008

(30) Foreign Application Priority Data
Dec. 29, 2006    (KR)    .................. 10-2006-0137584

(51) Int. Cl.
*G02B 3/00*    (2006.01)
(52) U.S. Cl. ........................ 430/321; 430/397
(58) Field of Classification Search ........................ None
See application file for complete search history.

(56) References Cited
U.S. PATENT DOCUMENTS
6,218,077 B1    4/2001    Jin 6,558,878 B1 *    5/2003    Park et al. .................. 430/321
2005/0105188 A1 *    5/2005    Hayashi et al. ............. 359/619

FOREIGN PATENT DOCUMENTS
JP    5-288904    11/1993
JP    2001-356470 A *    12/2001
JP    2005-258349    9/2005

OTHER PUBLICATIONS

Computer-generated translation of JP 2001-356470 (Dec. 2001).*
Computer-generated translation of JP 5-288904 (Nov. 1993).*
Korean Patent Office Action, mailed Dec. 12, 2007 and issued in corresponding Korean Patent Application No. 10-2006-0137584.

* cited by examiner

*Primary Examiner*—John A. McPherson

(57) ABSTRACT

A method of fabricating a micro lens, the method including: forming a photo-sensitive film on a substrate; placing a photo mask at a predetermined distance from a top of the photo-sensitive film; exposing the photo-sensitive film by varying an area of exposure of the photo-sensitive film so as to selectively expose three-dimensional structures of the photo-sensitive film corresponding to desired micro lenses; and developing the photo-sensitive film such that the exposed three-dimensional structures remain. Also, there is provided a method of fabricating a master for a micro lens, in which a master material is applied on the photo-sensitive film with the three-dimensional structures to form a master having the three-dimensional structures transferred thereonto.

8 Claims, 4 Drawing Sheets

FABRICATION METHOD OF MICRO-LENS AND FABRICATION METHOD OF MASTER FOR MICRO-LENS

CROSS-REFERENCE TO RELATED APPLICATIONS

This application claims the priority of Korean Patent Application No. 2006-137584 filed on Dec. 29, 2006, in the Korean Intellectual Property Office, the disclosure of which is incorporated herein by reference.

BACKGROUND OF THE INVENTION

1. Field of the Invention

The present invention relates to a method of fabricating a micro lens, and more particularly, to a method of fabricating a master for a micro lens.

2. Description of the Related Art

Recent widespread use of portable imaging devices has increased a demand for high-performing micro lenses.

In general, micro lenses are known to be fabricated by a replica method using a mold. This replica method is broadly utilized to fabricate the micro lenses or a micro lens array having the micro lenses therein at a low cost. A conventional method of manufacturing or replicating the micro lenses includes a modified lithographic-galvanic (LIGA) process, isotropic etching of silicon, use of a gray scale mask, direct writing via E-beam or laser, precision machining of a mold as a master for a micro lens and reflow of a photo-sensitive material.

However, a conventional fabrication method of the micro lenses or micro lens array entails relatively considerable costs and time to attain lenses of a desired precise shape. Besides, the conventional method accompanies difficulty in fabricating the micro lenses of a various shape such as a lens with a great numerical aperture and an aspherical lens due to difficulties involving a reflow process and manufacture of a molding.

SUMMARY OF THE INVENTION

An aspect of the present invention provides a method of fabricating a micro lens in which an area of exposure is varied by a photolithography process to achieve various three-dimensional structures more precisely.

An aspect of the present invention also provides a method of manufacturing a master for a micro lens in which an area of exposure is varied by a photolithography process to achieve various three-dimensional structures more precisely.

According to an aspect of the present invention, there is provided a method of fabricating a micro lens, the method including: forming a photo-sensitive film on a substrate; placing a photo mask at a predetermined distance from a top of the photo-sensitive film; exposing the photo-sensitive film by varying an area of exposure of the photo-sensitive film so as to selectively expose three-dimensional structures of the photo-sensitive film corresponding to desired micro lenses; and developing the photo-sensitive film such that the exposed three-dimensional structures remain.

The area of exposure of the photo-sensitive film may be varied by adjusting a distance between the photo mask and the photo-sensitive film. Here, the distance between the photo mask and the photo-sensitive film is adjusted by moving the photo mask in a vertical direction.

The exposing the photo-sensitive film may be performed in succession or in phases. In a case where the exposing the photo-sensitive film may be performed in phases, the exposing the photo-sensitive film may include: exposing the photo-sensitive film after the placing a photo mask at a predetermined distance from a top of the photo-sensitive film; temporarily stopping the exposing and moving the photo mask in a vertical direction such that the distance is changed; and additionally exposing the photo-sensitive film using the moved photo mask.

The moving the photo mask in a vertical direction and the additionally exposing the photo-sensitive film may be repeated at least once.

The area of exposure of the photo-sensitive film may be varied by replacing the photo mask with another photo mask having openings sized different from openings of the photo mask.

The substrate may be a transparent substrate and the method may further include transferring the three-dimensional structures onto the substrate by etching the photo-sensitive film of the remaining three-dimensional structures and the substrate simultaneously, after the developing the photo-sensitive film.

According to another aspect of the present invention, there is provided a method of fabricating a master for a micro lens, the method including: forming a photo-sensitive film on a substrate; placing a photo mask at a predetermined distance from a top of the photo-sensitive film; exposing the photo-sensitive film by varying an area of exposure of the photo-sensitive film so as to selectively expose three-dimensional structures of the photo-sensitive film corresponding to desired micro lenses; developing the photo-sensitive film such that the exposed three-dimensional structures remain; and forming a master having the tree-dimensional structures transferred thereonto by applying a master material on the photo-sensitive film with the three-dimensional structures.

The master material may be one of a curing resin and a metal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIGS. 1A to 1E are cross-sectional views illustrating a method of fabricating a micro lens according to an exemplary embodiment of the invention.

Figure 1A:
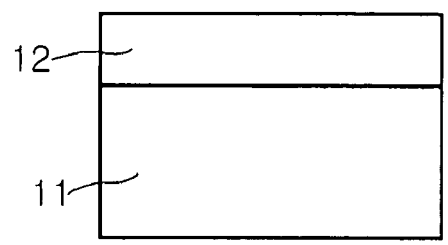
FIGS. 1A to 1E are cross-sectional views illustrating a method of fabricating a micro lens according to an exemplary embodiment of the invention.

As shown in FIG. 1A, the method starts with forming a photo-sensitive film 12 on a substrate 11. As in the present embodiment, the substrate 11 may be a transparent substrate to be used as a member for a micro lens. However, in a method of fabricating a master for a micro lens, the substrate 11 is not limited to a transparent material. The photo-sensitive film 12 may be a typical photo resist material which can be cured by selective exposure using e.g., ultraviolet rays. In the present embodiment, the photo-sensitive film 12 adopts a positive photo resist in which an exposure area is cured, but is not limited thereto. The photo-sensitive film 12 may utilize a negative photo resist material.

Thereafter, a photo mask is placed on the photo-sensitive film, and the photo-sensitive film is exposed by varying an area of exposure of the photo-sensitive film to selectively expose three-dimensional structures of the photo-sensitive film corresponding to desired micro lenses.

Figure 1B:
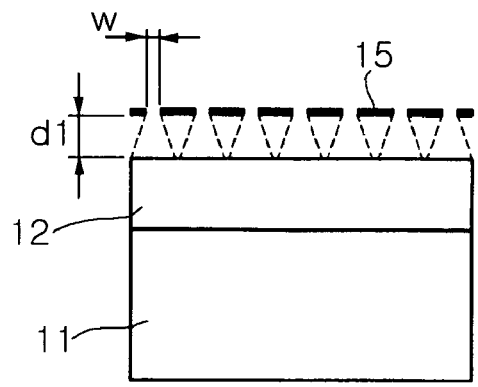
Figure 1C:
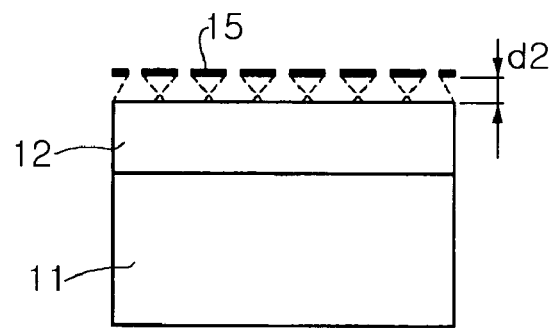

For example, as in the present embodiment, a distance between the photo mask 15 and the photo-sensitive film 12 may be varied in phases. More specifically, the photo mask 15 is placed at a first distanced d1 from a top of the photo-sensitive film 12 to be exposed primarily as shown in FIG. 1B. Then, the photo mask 15 is adjusted to be placed at a second distance d2 from the top of the photo sensitive film 12 to be exposed secondarily as shown in FIG. 1C.

A distance between the photo mask 15 and the photo-sensitive film 12 may be varied to adjust the area of exposure by moving the photo mask 15 in a vertical direction.

In the exposure process, the area of exposure is determined by size of openings of the photo mask 15. But increase in the distance between the photo mask 15 and the photo-sensitive film 12 increases the area of exposure due to diffraction of light irradiated. Moreover, the increased distance reduces an exposure amount per unit area when total exposure amounts are identical. This principle ensures precise control of the exposure area and the exposure amount. The photolithography process as described above allows various three-dimensional structures to be obtained precisely.

Figure 2:
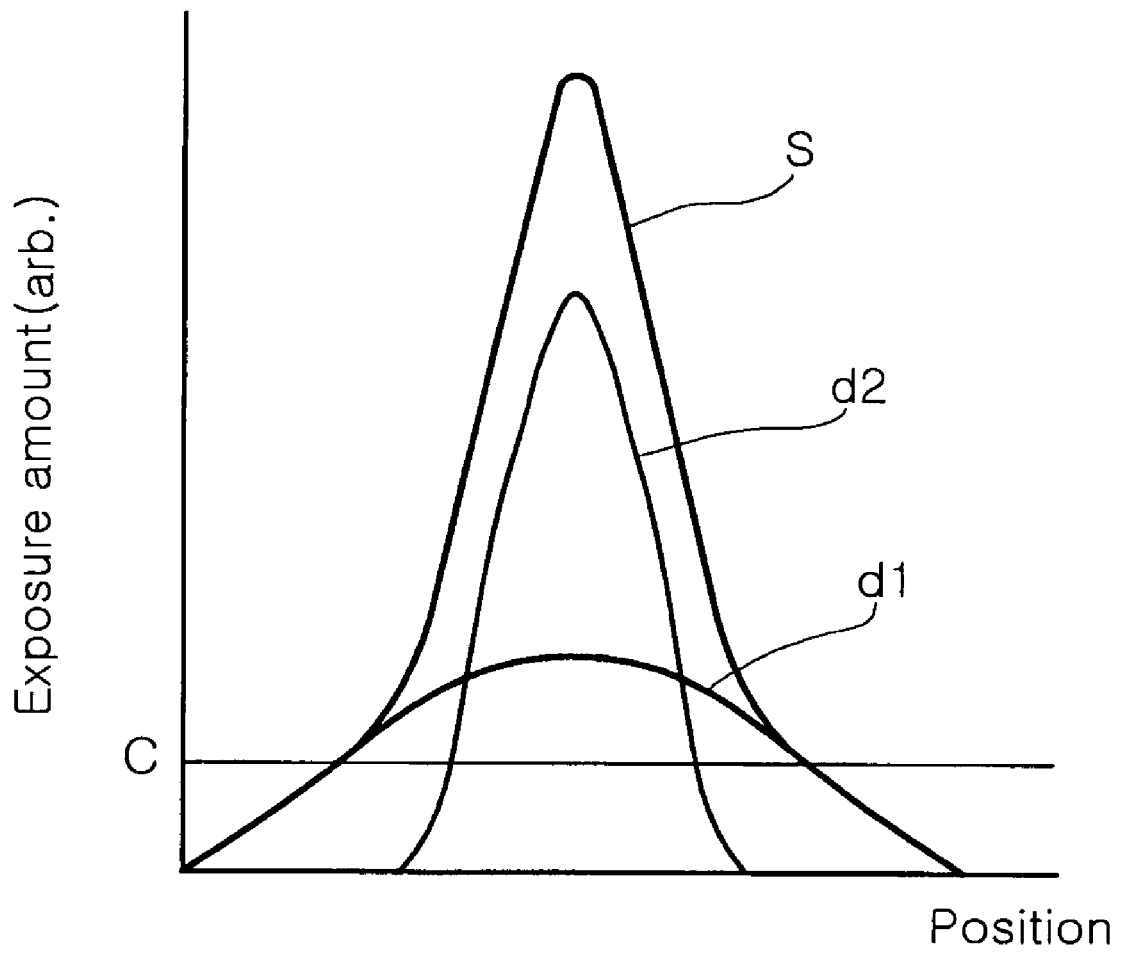
FIG. 2 is a graph illustrating an exposure amount in an exposure process where a mask of FIG. 1B is moved in a vertical direction as in FIG. 1C to be exposed.

More specifically, the exposure area and the exposure amount obtained from FIGS. 1B and 1B can be described with reference to FIG. 2.

First, in the primary exposure of FIG. 1B, a relatively greater distance d1 between the photo mask 15 and the photo-sensitive film 12 increases the area of exposure owing to diffraction. However, a distribution of the exposure amount indicated with d1 with respect to exposure positions is relatively smoothly curved and an exposure amount per unit area is relatively low.

Subsequently, in the secondary exposure of FIG. 1C, a relatively smaller distance d2 between the photo mask 15 and the photo-sensitive film 12 reduces the area of exposure over the primary exposure and relatively increases the exposure amount per unit area in a central portion.

In these primary and secondary exposures, a final exposure amount distribution S in each position is defined by a sum of two exposure amount distributions as indicated with d1 and d2. In consequence, a structure obtained from a following development process may have a distribution shaped as indicated with S equal to or exceeding a critical exposure amount C. In the present embodiment, the first and secondary exposures are performed by varying a distance between the photo mask and the photo-sensitive film. However, to achieve a structure of more precise and complicated shape, an additional exposure may be repeated at least once after the distance between the photo mask and the photo-sensitive film is varied again.

Figure 1D:
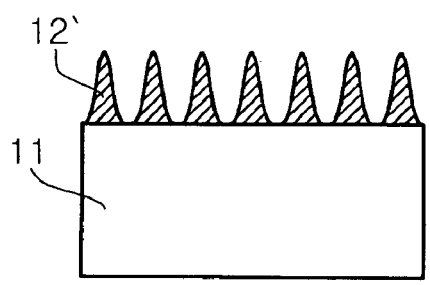

FIG. 1D illustrates remaining portions 12', i.e., three-dimensional structures of the photo-sensitive film obtained by developing the photo-sensitive film 12 exposed as in FIGS. 1B and 1C. The remaining portions 12' exhibit the shape in accordance with the distribution plotted in FIG. 2. The exposure area and the exposure amount distribution per unit area are adjusted to produce structures with a high aspect ratio.

Figure 3:
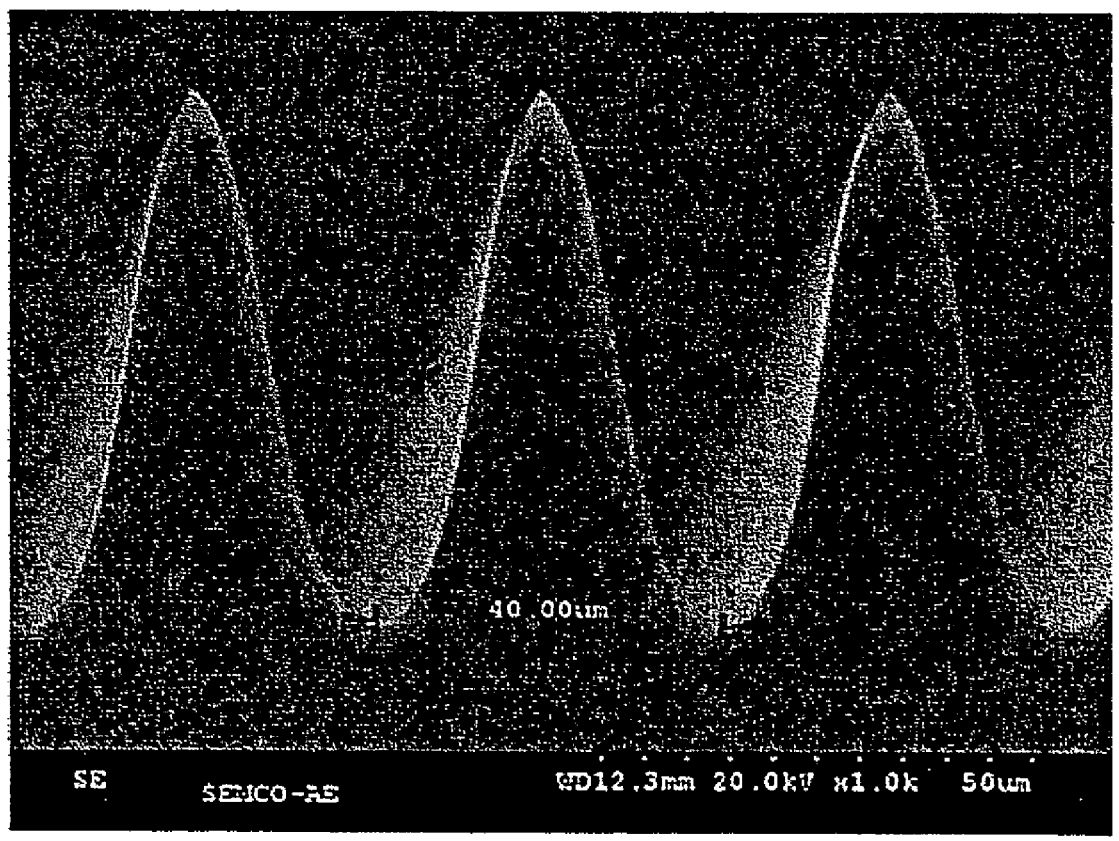
FIG. 3 is a picture illustrating a cross-section of a photo-sensitive film having a three-dimensional array structure formed according to an exemplary embodiment of the invention.

FIG. 3 is a picture illustrating a cross-section of a photo-sensitive film having a three-dimensional array structure formed by a secondary exposure process similar to the present embodiment. As shown in FIG. 3, each structure has been developed to have a high aspect ratio. Further, the method of the present embodiment may be easily applicable to a method of attaining an aspherical shape such as a triangle prism and a pyramid by adequately designing openings of the mask.

Figure 1E:
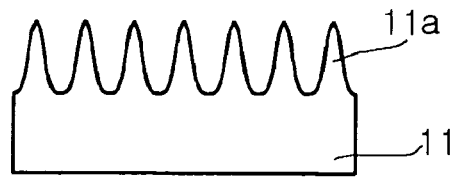

Additionally, as shown in FIG. 1E, the three-dimensional structures 12' of the photo-sensitive film developed are transferred onto the transparent substrate 11, thereby directly forming a micro lens array 11a corresponding to the three-dimensional structures on the substrate 11. To ensure this process, the photo-sensitive film 12' of the three-dimensional structures and the substrate 11 may be dry-etched with an equal thickness.

In the present embodiment, the exposures are performed while the distance of the photo-sensitive film and the photo mask is varied in phases. But the invention is not limited thereto. Alternatively, during the partial or entire duration of the exposure process, the exposures may be carried out in succession while changing the distance between the mask and the photo-sensitive film. Alternatively, the exposures may be performed for different times depending on varied positions.

Moreover, the present embodiment has a characteristic that the area of exposure of the photo-sensitive film is varied to attain precise structures. Thus, other methods may be employed to vary the area of exposure and a shape of the structures in addition to the distance between the photo mask and the photo-sensitive film. For example, the openings of the photo mask may be adjusted in size and thus the exposure may be halted temporarily to substitute the photo mask with another photo mask having openings shaped and sized different from the openings of the photo mask.

FIG. 1A to FIG. 1E illustrate a process of forming the micro lenses directly on the substrate but the present embodiment may be applied to a method of fabricating a master for a micro lens, which can be more beneficially utilized in a mass-production system. FIGS. 4A to 4E are cross-sectional views illustrating a method of fabricating the method of fabricating a master for a micro lens according to an exemplary embodiment of the invention.

Figure 4A:
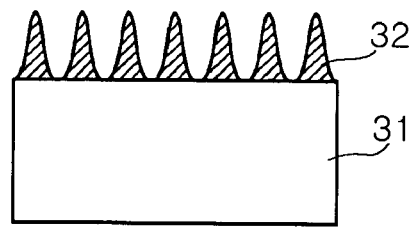
FIGS. 4A to 4E are cross-sectional views illustrating a method of fabricating a master for a micro lens according to an exemplary embodiment of the invention.

First, as shown in FIG. 4A, a substrate 31 having a photo-sensitive film 32 configured as a three-dimensional micro lens array is provided. The photo-sensitive film 32 with three-dimensional structures is obtained by an exposure process in which an area of exposure is varied according to the present embodiment. For example, the photo-sensitive film 32 is understood to be produced by processes of FIGS. 1A to 1D.

Figure 4B:
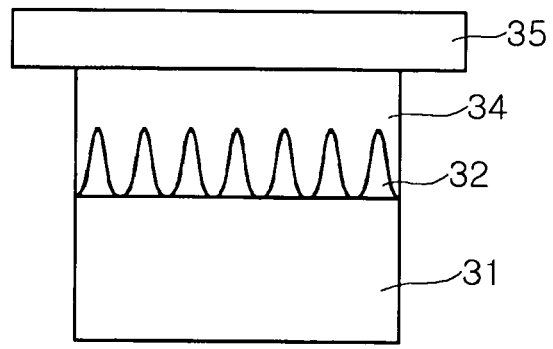

As shown in FIG. 4B, a replica process is performed to transfer the three-dimensional structures of the photo-resist film 32 onto a desired master 34. In this process, an ultraviolet ray curing resin is applied on a plate 35 and the photo-resist film 32 with the three-dimensional structures is disposed thereon. Then ultraviolet rays are irradiated to produce a master 34 formed of the ultraviolet curing resin. Of course, a method of fabricating the master of the present embodiment is not limited thereto, and other polymer-based curing resin may be employed to fabricate the master. Alternatively, the master may be fabricated utilizing a metal such as nickel by one of electroless plating, deposition and sputtering.

As described above, various known replica processes may produce the master 34 having the variously-shaped three-dimensional structures 32 of the photo-sensitive film transferred thereonto.

Figure 4C:
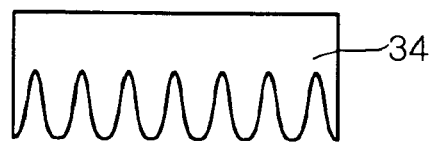
Figure 4D:
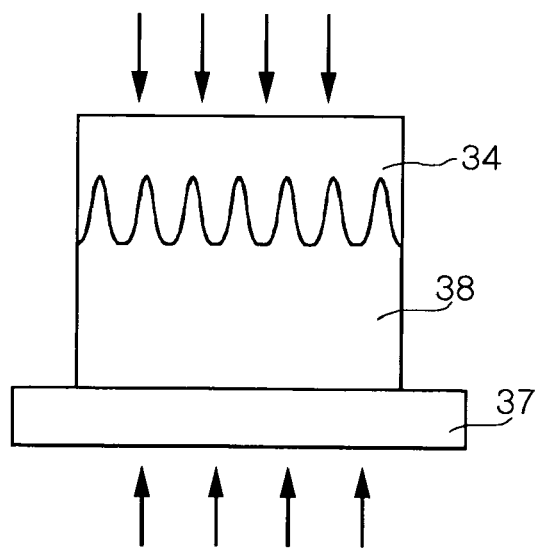
Figure 4E:
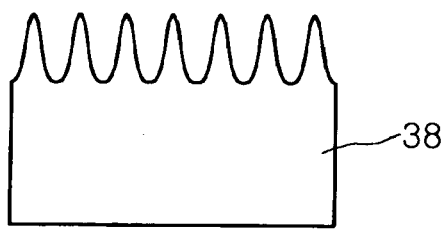

The master 34 obtained is placed on a lens forming material 38 such as a transparent resin applied on another plate 37, as shown in FIG. 4C, and then separated as shown in FIG. 4D to repeatedly produce a lens product 38 with various three-dimensional structures.

As set forth above, according to exemplary embodiments of the invention, a distance between a photo mask and a photo-sensitive film is varied in phases or in succession to adjust an area of exposure. This produces a lens of a desired shape or a master for the lens easily and precisely.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of fabricating a micro lens, the method comprising:
    forming a photo-sensitive film on a substrate;
    placing a photo mask at a predetermined distance from a top of the photo-sensitive film;
    exposing the photo-sensitive film by varying an area of exposure of the photo-sensitive film so as to selectively expose three-dimensional structures of the photo-sensitive film corresponding to desired micro lenses; and
    developing the photo-sensitive film such that the exposed three-dimensional structures remain,
    wherein the area of exposure of the photo-sensitive film is varied by adjusting a distance between the photo mask and the photo-sensitive film, and
    wherein the exposing the photo-sensitive film comprises
    exposing the photo-sensitive film after the placing a photo mask at a predetermined distance from a top of the photo-sensitive film,
    temporarily stopping the exposing and moving the photo mask in a vertical direction such that the distance is changed, and
    additionally exposing the photo-sensitive film using the moved photo mask.

2. The method of claim 1, wherein the moving the photo mask in a vertical direction and the additionally exposing the photo-sensitive film are repeated at least once.

3. The method of claim 1, further comprising transferring the three-dimensional structures onto the substrate by etching the photo-sensitive film of the remaining three-dimensional structures and the substrate simultaneously, after the developing the photo-sensitive film.

4. The method of claim 1, wherein the three-dimensional structures are one of prism structures and pyramid structures.

5. A method of fabricating a master for a micro lens, the method comprising:
    forming a photo-sensitive film on a substrate;
    placing a photo mask at a predetermined distance from a top of the photo-sensitive film;
    exposing the photo-sensitive film by varying an area of exposure of the photo-sensitive film so as to selectively expose three-dimensional structures of the photo-sensitive film corresponding to desired micro lenses;
    developing the photo-sensitive film such that the exposed three-dimensional structures remain; and
    forming a master having the three-dimensional structures transferred thereonto by applying a master material on the photo-sensitive film with the three-dimensional structures,
    wherein the area of exposure of the photo-sensitive film is varied by adjustinq a distance between the photo mask and the photo-sensitive film, and
    wherein the exposing the photo-sensitive film comprises
    exposing the photo-sensitive film after the placing a photo mask at a predetermined distance from a top of the photo-sensitive film,
    temporarily stopping the exposing and moving the photo mask in a vertical direction such that the distance is changed, and
    additionally exposing the photo-sensitive film using the moved photo mask.

6. The method of claim 5, wherein the moving the photo mask in a vertical direction and the additionally exposing the photo-sensitive film are repeated at least once.

7. The method of claim 5, wherein the master material is one of a curing resin and a metal.

8. The method of claim 5, wherein the three-dimensional structures are one of prism structures and pyramid structures.

* * * * *

UNITED STATES PATENT AND TRADEMARK OFFICE
CERTIFICATE OF CORRECTION

| | | |
|---|---|---|
| PATENT NO. | : 7,781,155 B2 | Page 1 of 1 |
| APPLICATION NO. | : 12/005668 | |
| DATED | : August 24, 2010 | |
| INVENTOR(S) | : Hyong Sik Won et al. | |

It is certified that error appears in the above-identified patent and that said Letters Patent is hereby corrected as shown below:

Column 6, Line 27 in Claim 5, delete "adjustinq" and insert -- adjusting --, therefor.

Signed and Sealed this
Fifth Day of April, 2011

David J. Kappos
*Director of the United States Patent and Trademark Office*